US012666534B2

(12) United States Patent
Lee et al.

(10) Patent No.: US 12,666,534 B2
(45) Date of Patent: Jun. 23, 2026

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Youn Gyu Han, Suwon-si (KR); Jin Oh Park, Suwon-si (KR); Yong Wan Ji, Suwon-si (KR); Yong Duk Lee, Suwon-si (KR); Eun Sun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 479 days.

(21) Appl. No.: 18/135,414

(22) Filed: Apr. 17, 2023

(65) Prior Publication Data

US 2024/0147620 A1      May 2, 2024

(30) Foreign Application Priority Data

Nov. 2, 2022    (KR) ......................... 10-2022-0144591

(51) Int. Cl.
| *H05K 1/11* | (2006.01) |
| *H05K 1/185* | (2026.01) |
| *H05K 3/46* | (2006.01) |
| *H10W 90/00* | (2026.01) |

(52) U.S. Cl.
CPC ............. *H05K 1/115* (2013.01); *H05K 1/186* (2013.01); *H05K 3/4697* (2013.01); *H10W 90/701* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 8,872,349 B2 * | 10/2014 | Chiu | ................... | H01L 23/5381 |
| | | | | 257/E23.145 |
| 11,094,637 B2 * | 8/2021 | Rubin | ................. | H01L 23/5386 |
| 11,910,527 B2 | 2/2024 | Kim et al. | | |

(Continued)

FOREIGN PATENT DOCUMENTS

| | | |
|---|---|---|
| KR | 10-2022-0013703 A | 2/2022 |
| KR | 10-2022-0086320 A | 6/2022 |
| KR | 10-2022-0141643 A | 10/2022 |

OTHER PUBLICATIONS

Office Action issued on Apr. 20, 2026 in corresponding Korean Patent Application No. 10-2022-0144591 with English translation.

*Primary Examiner* — Timothy J Thompson
*Assistant Examiner* — John B Freal
(74) *Attorney, Agent, or Firm* — Morgan, Lewis & Bockius LLP

(57) ABSTRACT

The present disclosure relates to a printed circuit board including, a first insulating layer, a first metal layer disposed on the first insulating layer, a bridge disposed on the first metal layer and including a bridge insulating layer and a bridge circuit layer, a second insulating layer disposed on the first insulating layer and covering at least a portion of the bridge, a second metal layer disposed on the second insulating layer, and a connecting via penetrating the bridge and the second insulating layer to connect the first metal layer to the second insulating layer. The connecting via is spaced apart from the bridge circuit layer.

20 Claims, 5 Drawing Sheets

(56)                    References Cited

U.S. PATENT DOCUMENTS

| | | | |
|---|---|---|---|
| 2013/0223033 A1* | 8/2013 | Mano | H05K 1/185 |
| | | | 336/200 |
| 2018/0102311 A1* | 4/2018 | Shih | H01L 21/4857 |
| 2020/0273840 A1* | 8/2020 | Elsherbini | H01L 23/42 |
| 2021/0134728 A1 | 5/2021 | Rubin et al. | |
| 2022/0192020 A1 | 6/2022 | Jung et al. | |

* cited by examiner

PRINTED CIRCUIT BOARD

CROSS-REFERENCE TO RELATED APPLICATION(S)

This application claims benefit of priority to Korean Patent Application No. 10-2022-0144591 filed on Nov. 2, 2022 in the Korean Intellectual Property Office, the disclosure of which is incorporated herein by reference in its entirety.

TECHNICAL FIELD

The present disclosure relates to a printed circuit board.

Due to the recent development of artificial intelligence (AI) technology, multi-chip packages including memory chips, such as HBM, for exponentially increasing data processing and processor chips, such as Central Processing Unit (CPU), Graphics Processing Unit (GPU), Application Specific Integrated Circuit (ASIC), and (Field Programmable Gate Array FPGA) are being used. Research continues to improve reliability while simplifying and diversifying chip connections and signal paths in a substrate structure in which various chips are mounted on a substrate.

SUMMARY

An aspect of the present disclosure is to provide a printed circuit board having various vertical connections of signal paths in a printed circuit board for mounting electronic components and chips, etc.

An aspect of the present disclosure is to provide a printed circuit board for implementing signal paths more simply.

Another aspect of the various purposes of the present disclosure is to provide a printed circuit board manufacturing method which can improve reliability.

One among the various solutions proposed through the present disclosure is to provide a printed circuit board including a first insulating layer, a first metal layer disposed on the first insulating layer, a bridge disposed on the first metal layer and including a bridge insulating layer and a bridge circuit layer, a second insulating layer disposed on the first insulating layer and covering at least a portion of the bridge, a second metal layer disposed on the second insulating layer, and a connecting via penetrating the bridge and the second insulating layer to connect the first metal layer to the second insulating layer. The connecting via is spaced apart from the bridge circuit layer.

The other of various solutions proposed through the present disclosure is to provide a printed circuit board including a first insulating layer, a bridge disposed on one surface of the first insulating layer, and including a bridge insulating layer and a bridge circuit layer, a first metal layer embedded on the other surface side of the first insulating layer, a second insulating layer disposed on the one surface of the first insulating layer and covering at least a portion of the bridge, a second metal layer disposed on one surface of the second insulating layer, and a connecting via penetrating the bridge to connect the first metal layer to the second insulating layer. The connecting via is spaced apart from the bridge circuit layer.

The other of various solutions proposed through the present disclosure is to provide a printed circuit board including a first insulating layer; a first metal layer disposed on the first insulating layer; a bridge disposed on the first metal layer, and including a bridge insulating layer and a bridge circuit layer; a second insulating layer disposed on the first insulating layer, and covering at least a portion of the bridge; a second metal layer disposed on the second insulating layer; a connecting via penetrating the bridge and the second insulating layer to connect the first metal layer to the second metal layer; a bottom metal layer embedded in the first insulating layer and have a surface externally exposed from the printed circuit board; and a bottom via disposed in the first insulating layer and connecting the bottom metal layer and the first metal layer to each other. The bottom via and the connecting via overlap each other in a stacking direction of the first insulating layer and the second insulating layer As one of the various effects of the present disclosure, provided is a printed circuit board capable of varying the vertical connection of the signal paths.

Provided is a printed circuit board capable of more simply implementing the signal paths as a different effect among the various effects of the present disclosure.

Provided is a printed circuit board capable of improving reliability as one of the various effects of the present disclosure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
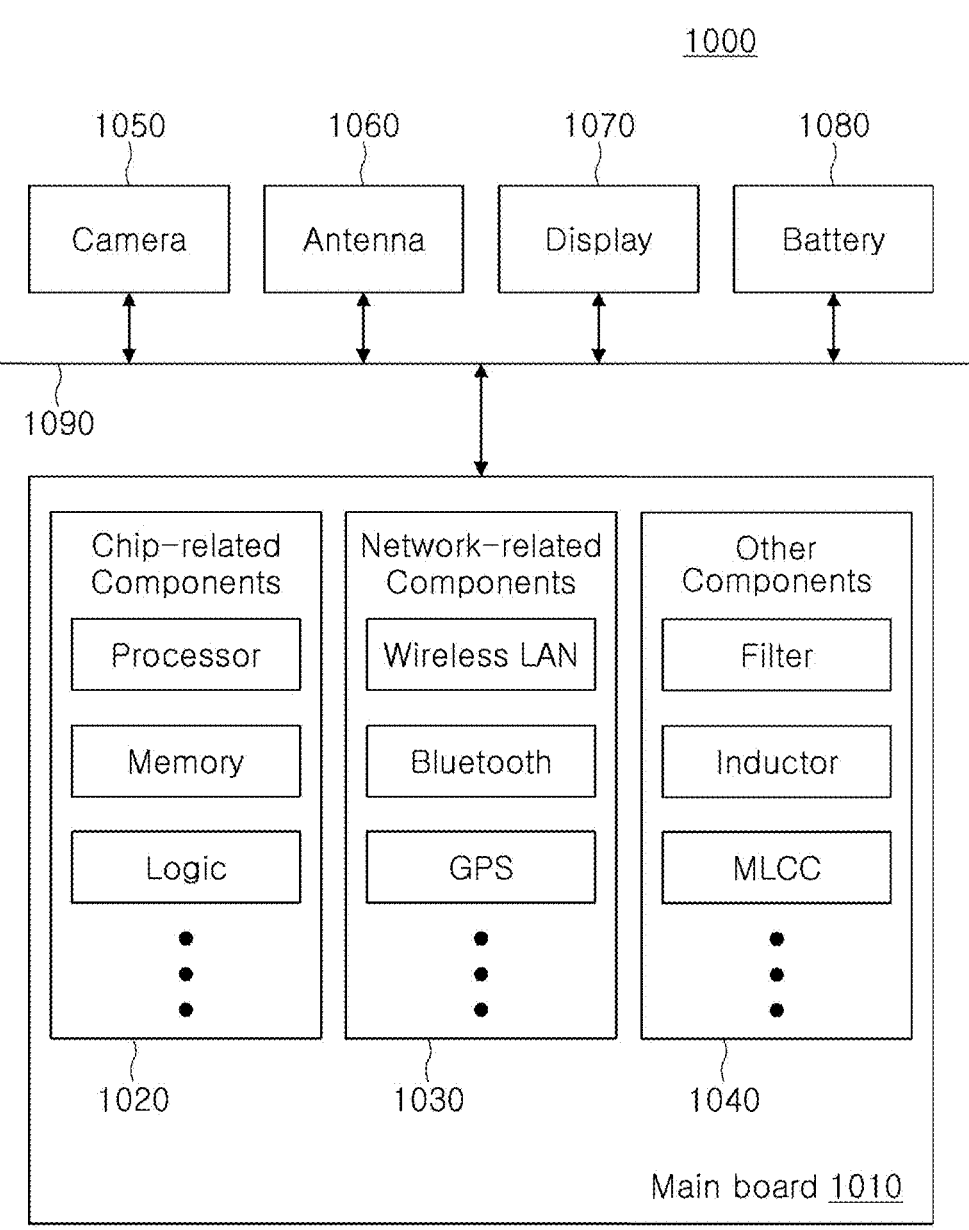
FIG. 1 is a block diagram schematically illustrating one embodiment of an electronic device system.

FIG. 1 is a block diagram schematically illustrating an embodiment of an electronic device system.

Referring to the figure, an electronic device (1000) accommodates a mainboard (1010). Chip-related components (1020), network-related components (1030), and other components (1040) are physically and/or electrically connected to the mainboard (1010). These are also combined with other electronic components described below to form various signal lines (1090).

The chip-related components (1020) include memory chips such as volatile memory (e.g., DRAM), non-volatile memory (e.g., ROM), and flash memory, etc.; application processor chips such as central processors (e.g., CPUs), graphics processors (e.g., GPUs), digital signal processors, cryptographic processors, microprocessors, microcontrollers, etc.; logic chips such as analog-to-digital converters and application-specific IC (ASIC), etc., and the present disclosure is not limited thereto, and other chip-related electronic components may also be included.

Also, it is natural that these chip-related components (1020) can be combined with each other. The chip-related components (1020) may be in the form of a package containing the chip or electronic component described above.

The network-related components (1030) include Wi-Fi (IEEE 802.11 family, etc.), WiMAX (IEEE 802.16 family, etc.), IEEE 802.20, LTE (long term evolution), EV-DO, HSPA+, HSDPA+, HSUPA+, EDGE, GSM, GPS, GPRS, CDMA, DECT, Bluetooth, 3G, 4G, 5G, and any other wireless and wired protocols subsequently designated are included, and are not limited thereto, and any of a number of other wireless or wired standards or protocols may also be included. Also, it is natural that the network-related components (1030) can be combined with the chip-related component (1020).

Other components (1040) include high frequency inductors, ferrite inductors, power inductors, ferrite beads, Low Temperature Co-Firing Ceramics (LTCC), Electro Magnetic Interference (EMI) filter, and Multilayer Ceramic Capacitor (MLCC). However, the present disclosure is not limited thereto, and can also include passive disclosure in the form of chip components used for various other purposes. Moreover, other components (1040) may be combined with the chip-related components (1020) and/or the network-related components (1030).

Depending on the type of electronic device (1000), the electronic device (1000) may include other electronic components that may or may not be physically and/or electrically connected to the mainboard (1010). Embodiments of other electronic components include a camera module (1050), an antenna module (1060), a display (1070), and a battery (1080). However, the present disclosure is not limited thereto, and may be audio codecs, video codecs, power amplifiers, compasses, accelerometers, gyroscopes, speakers, mass storage devices (for example, hard disk drives), compact disks (CDs), digital versatile disks (DVDs), etc. It is natural that other electronic components used for various purposes may also be included depending on the type of electronic device (1000).

The electronic device (1000) may be a smart phone, a personal digital assistant, a digital video camera, a digital still camera, a network system, a computer, a monitor, a tablet, a laptop, a netbook, a television, a video game, a smartwatch, an automotive component, etc. However, the present disclosure is not limited thereto, and may be any other electronic device for processing data.

Figure 2:
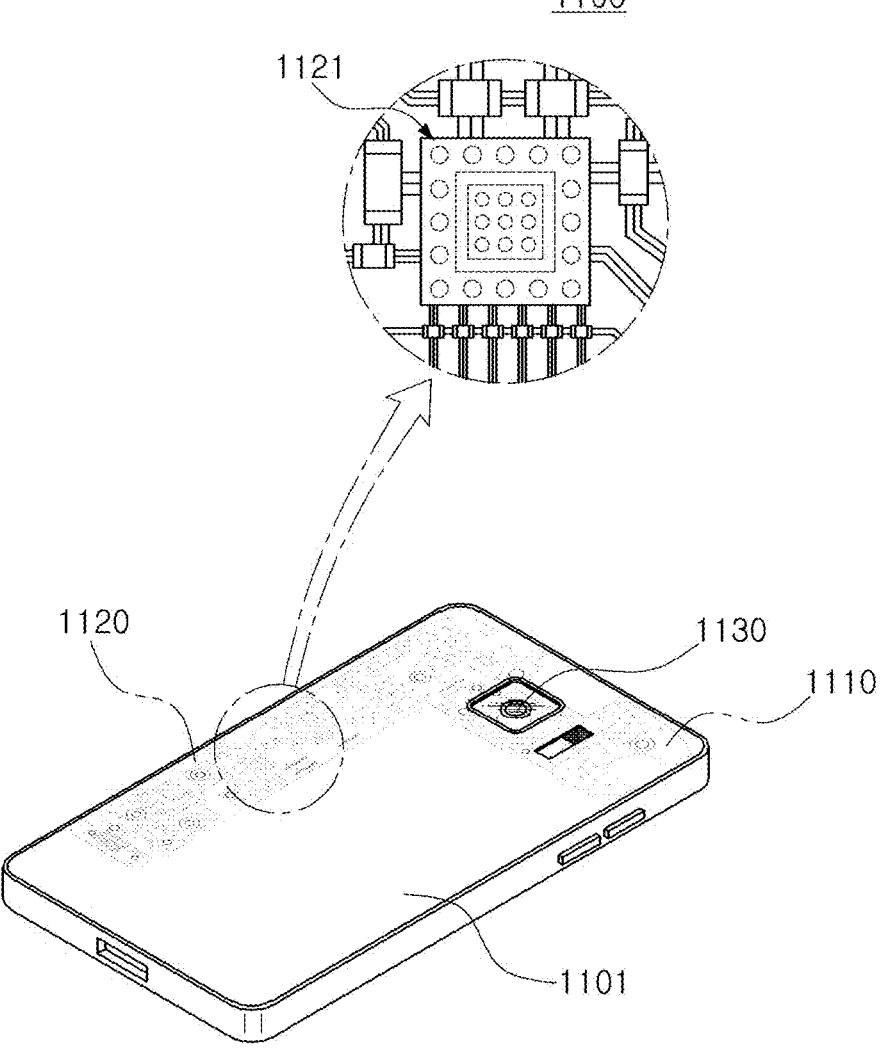
FIG. 2 is a perspective view schematically illustrating one embodiment of an electronic device.

FIG. 2 is a perspective view schematically illustrating an embodiment of the electronic device.

Referring to the figures, the electronic device may be, for example, a smartphone (1100). A motherboard (1110) is received inside the smartphone (1100), and various components (1120) are physically and/or electrically connected to this motherboard (1110). Also, other components that may or may not be physically and/or electrically connected to the mainboard (1110), such as camera module (1130) and/or speaker (1140), are received inside. Some of the components (1120) may be the chip-related components as described above, for example, they may be component package (1121), but the present disclosure is not limited thereto. The component package (1121) may be in the form of a printed circuit board with electronic components including active components and/or passive components disposed as surface mounts. Furthermore, the component package (1121) may be in the form of a printed circuit board in which an active component and/or a passive component are embedded.

Meanwhile, the electronic device is not necessarily limited to the smartphone (1100), and may be another electronic device as described above.

Printed Circuit Board

Figure 3:
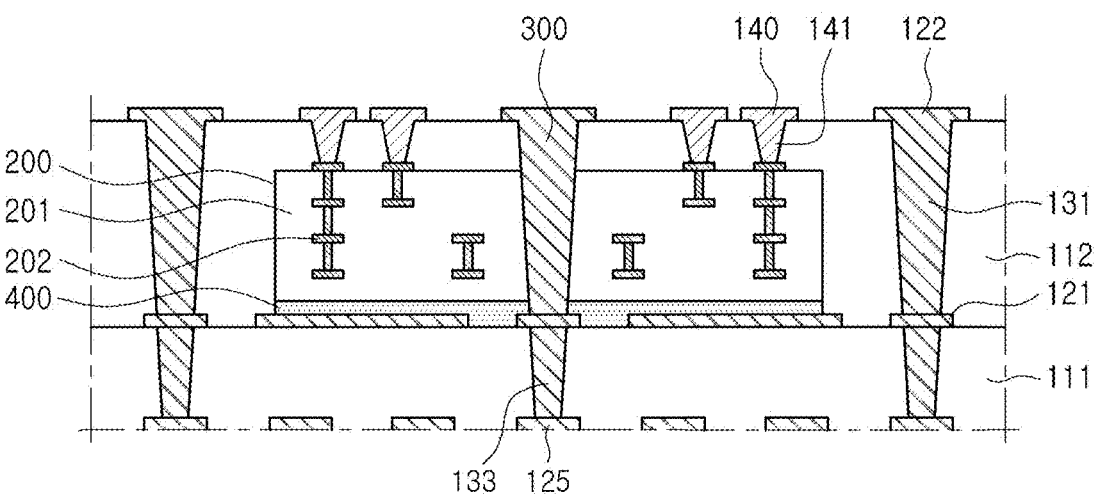
FIG. 3 is a cross-sectional view schematically illustrating a printed circuit board according to one embodiment.

FIG. 3 is a cross-sectional view schematically illustrating a printed circuit board according to one embodiment.

Referring to FIG. 3, the printed circuit board according to one embodiment includes the first insulating layers (111), the first metal layers (121) disposed on the first insulating layers (111), the bridges (200) disposed on the first metal layers (121), and including the bridge insulating layers (201) and the bridge circuit layers (202), the second insulating layer (112) disposed on the first insulating layer (111), and covering at least a portion of the bridges (200), the second metal layers (122) disposed on the second insulating layer (112), and the connecting via (300) penetrating the bridges (200) and the second insulating layer (112) to connect the first metal layers (121) and the second metal layers (122).

The first insulating layer (111) may include insulating materials. The insulating materials may include thermosetting resins such as epoxy resins, thermoplastic resins such as polyimides, or materials containing inorganic fillers, organic fillers, and/or glass fibers (Glass Fiber, Glass Cloth, and/or Glass Fabric) together with such resins. The insulating materials may be a photosensitive material and/or a non-photosensitive material. For example, the insulating material of Solder Resist (SR), Ajinomoto Build-up Film (ABF), FR-4, Bismaleimide Triazine (BT), Prepreg (PPG), and Resin Insulated Copper (RCC), and an insulating material formed of Copper Clad Laminate (CCL), etc., can be used as insulating materials, but the present disclosure is not limited thereto, and other polymeric materials can be used.

The first metal layers (121) may be disposed on the first insulating layer (111). In other words, the first metal layers (121) may be disposed on one surface of the first insulating layer (111) and have a structure protruding from the first insulating layer (111), but the present disclosure is not limited thereto. Although it is not illustrated in FIG. 3, the first metal layers (121) may have a structure embedded in one side surface of the first insulating layer (111). In this case, the protruding structure does not necessarily mean that all of the first metal layers (121) are protruded from one side of the first insulating layer (111), and it can include a structure in which a portion of the first metal layers (121) is embedded in the first insulating layer (111) while the other surface side protrudes. Meanwhile, the structure in which the first metal layers (121) are embedded on one surface side of the first insulating layer (111) means that the first metal layers (121) is embedded on one surface side of the first insulating layer (111), and the side of the first metal layers (121) is covered by the first insulating layer (111), and one surface of the first metal layers (121) refers to a structure exposed to one surface of the first insulating layer (111). In other words, placing the first metal layers (121) on the first insulating layer (111) can include both being disposed on one surface of the first insulating layer (111) and being embedded and disposed on one surface side of the first insulating layer (111). A bottom metal layer (125) may be embedded in the first insulating layer (111) and have a surface externally exposed from the printed circuit board. A bottom via (133) may be disposed in the first insulating layer (111) and connect the bottom metal layer (125) and the first metal layer (121) to each other. The bottom via (133) and the connecting via (300) may overlap each other in a stacking direction of the first insulating layer (111) and the second insulating layer (112).

The first metal layers (121) include the metal materials. The metal materials may include copper (Cu), aluminum (Al), silver (Ag), tin (Sn), gold (Au), nickel (Ni), lead (Pb), titanium (Ti), and/or alloys thereof, and may preferably include copper (Cu), but the present disclosure is not limited thereto. The first metal layers (121) may be a general circuit pattern, and can perform various functions depending on the design, such as components being mounted. The first metal layers (121) may be formed by any of a Semi Additive Process (SAP), a Modified Semi Additive Process (MSAP), Tenting (TT), or subtractive construction methods, but the present disclosure is not limited thereto.

The first metal layers (121) may be formed of a plurality of patterns, may be formed of a metal plate, and can be formed of the plurality of patterns and the metal plate together. The plurality of patterns and metal plates can be formed simultaneously, but the present disclosure is not limited thereto, and the patterns and metal plates may be formed step by step. Also, the first metal layers (121) may electrically send and receive signals from metal layers and circuit patterns further disposed in other layers, but the first metal layers (121) may perform functions by being electrically short-circuited to other patterns. For example, a part of the first metal layers (121) is composed of a metal plate, and the metal plate may perform a heat dissipation function or perform a ground function, but the present disclosure is not limited thereto, and it may be used as a flattening layer to mount other configurations. That is, the first metal layers (121) can be formed from the plurality of patterns and the metal plate, each of which can perform different functions.

The second insulating layer (112) may be disposed on the first insulating layer (111). The second insulating layer (112) can be disposed on the first insulating layer (111) to cover at least a portion of the first metal layers (121). Meanwhile, the second insulating layer (112) can cover at least a portion of the bridges (200). The second insulating layer (112) can cover the upper surface of the bridges (200) and may cover the side of the bridges (200).

The second insulating layer (112) may include insulating materials, and the material such as the first insulating layer (111) may be used, but the present disclosure is not limited thereto, and the second insulating layer may include materials different from the first insulating layer (111). The insulating materials may include thermosetting resins such as epoxy resins, thermoplastic resins such as polyimides, or materials containing inorganic fillers, organic fillers, and/or glass fibers (Glass Fiber, Glass Cloth, and/or Glass Fabric) together with such resins. The insulating materials may be a photosensitive material and/or a non-photosensitive material. For example, the insulating materials of Solder Resist (SR), Ajinomoto Build-up Film (ABF), FR-4, Bismaleimide Triazine (BT), Prepreg (PPG), and Resin Insulated Copper (RCC), as well as insulating materials such as Copper Clad Laminate (CCL), etc. can be used as the insulating materials, but not limited thereto, and other polymeric materials can be used.

The second metal layers (122) include the metal materials. The second metal layers (122) may include the same metal materials as the first metal layers (121), but the present disclosure is not limited thereto. The metal materials may include copper (Cu), aluminum (Al), silver (Ag), tin (Sn), gold (Au), nickel (Ni), lead (Pb), titanium (Ti), and/or alloys thereof, and may preferably include copper (Cu), but the present disclosure is not limited thereto. The first metal layers (121) may be a general circuit pattern, and can perform various functions depending on the design, such as components being mounted. The first metal layers (121) may be formed by any of Semi Additive Process (SAP), Modified Semi Additive Process (MSAP), Tenting (TT), or subtractive construction methods, but the present disclosure is not limited thereto.

The second metal layers (122) may be formed of a plurality of patterns, may be formed of a metal plate, and may be formed of the plurality of patterns and the metal plate together. The plurality of patterns and the metal plate may be formed simultaneously, but the present disclosure is not limited thereto, and the patterns and the metal plate may be formed step by step. Also, the second metal layers (122) may electrically send and receive signals to and from the metal layer and the circuit pattern further disposed in the other layer, but the second metal layers (122) may perform functions by being electrically short-circuited to other patterns. In other words, the second metal layers (122) may be formed from the plurality of patterns and the metal plate similar to the first metal layers (121), which can perform different functions. Meanwhile, the second metal layers (122) can function as a pad for mounting components. On the other hand, although not illustrated in FIG. 3, an electronic component can be mounted on one surface of the second metal layers (122), and the electronic component may be a known active component or passive component, but the present disclosure is not limited thereto, and other substrates, for example, a printed circuit board including a redistribution layer, can be mounted, and may also be connected to an interposer that connects between substrates or between the board and the chip. The configuration in which an electronic component is mounted on one surface of the second metal layers (122) is described below.

The printed circuit board according to one embodiment may further include a first vias (131) penetrating the second insulating layer to connect the first metal layers (121) and the second metal layers (122). The first via does not contact the bridges (200), and can perform a function independently of the bridges (200).

The first vias (131) may include the metal materials, and may include the metal materials such as the first metal layers (121) and the second metal layers (122), but the present disclosure is not limited thereto. Copper (Cu), aluminum (Al), silver (Ag), tin (Sn), gold (Au), nickel (Ni), lead (Pb), titanium (Ti), or alloys thereof can be used as metal materials. The first vias (131) may include a signal via, a ground via, a power via, etc., according to the design. The first vias (131) may include a plurality of vias, and each via hole may be completely filled with the metal materials, or the metal materials may be formed along the wall surface of the via hole. The first vias (131) can also be formed by a plating process such as the first metal layer and the second metal layers (122), for example, AP, SAP, MSAP, TT, etc., and may include a seed layer, which is an electroless plating layer, and an electrolytic plating layer formed based on this seed layer.

The first vias (131) may have a tapered shape so that a width of an upper surface is greater than a width of a lower surface, but the present disclosure is not limited thereto. If the second metal layers (122) are formed to be embedded in the second insulating layer (112), or the first metal layers (121) are formed to be embedded in the first insulating layer (111), or in the case of a so-called coreless substrate using a carrier substrate to manufacture an embedded pattern, the first vias (131) may have a tapered shape so that the width of the upper surface is narrower than the width of the lower surface. Also, the width of the first vias (131) may be formed to remain constant.

The first vias may be formed integrally with the second metal layers (122), but the present disclosure is not limited thereto, and may be formed integrally with the first metal layers (121) according to the manufacturing process and steps. After penetrating the second insulating layers (112), the second metal layers (122) can be formed together in the step of forming the first vias (131).

The printed circuit board according to one embodiment may include the bridges (200).

The bridges (200) are disposed on the first insulating layer (111) and may be embedded by the second insulating layer (112). The bridges (200) may include bridge insulating layers (201) and a bridge circuit layer (202). In other words, it can be possible to have a structure in which one surface of the first insulating layer (111) is disposed so that one side of the first insulating layer (111) is in contact the bridge (200), and at least a portion of the bridges (200) is covered by the second insulating layer (112). Meanwhile, the bridge circuit layers (202) can be electrically connected to the pads (140) via a pad via (141).

The bridges (200) may include one or more bridge insulating layers (201), the bridge circuit layers (202) disposed on the bridge insulating layers (201), respectively, and the bridge via layers penetrating the bridge circuit layers (202), respectively and connected to the bridge circuit layers (202), respectively. In FIG. 3, although the boundary between the bridge insulating layers (201) is not separately displayed in FIG. 3, the bridge insulating layers (201) can be disposed as many as the number of each bridge circuit layer (202), and the number of layers of the bridge insulating layers (201) and the bridge circuit layers (202) may be greater or less than is shown in the figures. Also, the bridge circuit layers (202) are illustrated to be symmetrical around the connecting vias (300), but this is only an embodiment, and the bridge circuit layers (202) and the bridge via layers can have various shapes.

The thickness of each bridge insulating layer (201) may be less than the thickness of the first insulating layers (111) or the thickness of the second insulating layers (112). Also, the density of the bridge circuit layers (202) may be greater than the density of the first metal layers (121) or the density of the second metal layers (122). In other words, the bridges (200) can be formed to be smaller than the first insulating layers (111) or the second insulating layers (112) of the printed circuit board, and the bridges (200) can form a relatively fine circuit pattern compared to the first metal layers (121) or the second metal layers (122). The thickness and width of the bridge via layers may also be less than the first vias (131) and second vias (132). In this case, the first vias (131) and the second vias (132) correspond to the configuration of a printed circuit board external to the bridges (200). The bridges (200) may perform the function of electrically connecting electronic components to each other through the bridge circuit layers (202) composed of a fine circuit pattern.

The bridge insulating layers (201) may include the insulating materials, and the insulating materials may be, for example, a Photo Imagable Dielectric (PID), but the present disclosure is not limited thereto. For example, thermosetting resins such as epoxy resins, thermoplastic resins such as polyimides, or these resins may be mixed with inorganic fillers, or impregnated with glass fiber (Glass fiber, glass cloth, glass fabric) with inorganic fillers, for example, prepreg, Ajinomoto Build-up Film (ABF), FR-4, Bismaleimide Triazine (BT) may also be used. Although not illustrated in FIG. 3, each layer of the bridge insulating layers (201) may be bounded from each other. Meanwhile, as illustrated in FIG. 3, each layer of the bridge insulating layers (201) may have uncertain boundaries with each other. When PID is used as a material for the bridge insulating layers (201), the thickness of the bridge insulating layers (201) can be minimized, and a photovia hole can be formed, so the bridge circuit layers (202) and the bridge via layers can be easily designed with high density. Even when a material other than the above-described PID material is used as the insulating materials of the bridge insulating layer (201), it is desirable that the bridge circuit layers (202) and the bridge via layers are designed to have higher density than the first metal layers (121), the second metal layers (122), the first vias (131), and the second vias (132).

The bridge circuit layers (202) are electrically connected to the pads (140) via pad vias (141). The bridge circuit layers (202) can perform various functions according to the design of the layer, but at least includes a signal pattern and a signal pad. The bridge circuit layers (202) can perform the function of connecting different electronic components, but the present disclosure is not limited thereto. The bridge circuit layers (202) can use conductive materials, specifically metal materials, such as copper (Cu), aluminum (Al), silver (Ag), tin (Sn), gold (Au), nickel (Ni), lead (Pb), titanium (Ti), or alloys thereof. FIG. 3 illustrates that the outermost layers of the bridge circuit layers (202) are exposed by the bridge insulating layers (201), but the present disclosure is not limited thereto, and the outermost layers of the bridge circuit layers (202) may be embedded by the bridge insulating layers (201). In order to have a structure in which the outermost layers of the bridge circuit layers (202) are embedded, the bridges (200) can be manufactured by using a known pattern embedding method.

The bridge via layers electrically connect the bridge circuit layers (202) formed in different layers, thereby forming an electrical path within the bridges (200). Each of bridge via layers may include a plurality of bridge vias. The bridge via layers may be composed of metal materials such as the bridge circuit layers (202), but the present disclosure is not limited thereto. Meanwhile, FIG. 3 illustrates that the bridge via layers are not tapered and are perpendicular to the bridge insulating layers (201), but the present disclosure is not limited thereto, and each bridge via can have a tapered shape, and the direction of taper can also be designed without restrictions.

The printed circuit board according to one embodiment includes connecting vias (300) connecting the first metal layers (121) and the second metal layers (122). The connecting vias (300) perform the function of electrically connecting the first metal layers (121) and the second metal layers (122), and can penetrate the bridges (200) and the second insulating layers (112). The connecting vias (300) pass through the bridges (200), but may not contact the bridge circuit layers (202). The connecting vias (300) may include the metal materials, and may include, but the present disclosure is not limited thereto, the metal materials such as the first metal layers (121) and the second metal layers (122). Copper (Cu), aluminum (Al), silver (Ag), tin (Sn), gold (Au), nickel (Ni), lead (Pb), titanium (Ti), or alloys thereof can be used as the metal materials. The connecting vias (300) may include a plurality of vias, and each via hole may be completely filled with the metal materials, or the metal materials may be formed along the wall surface of the via hole. The connecting vias (300) can be formed by plating processes such as the first metal layers and the second metal layers (122), for example, AP, SAP, MSAP, TT, etc., and may include a seed layer, which is an electroless plating layer, and an electrolytic plating layer formed based on this seed layer.

The connecting vias (300) pass through the bridges (200) and perform the function of connecting the first metal layers (121) and the second metal layers (122) disposed above and below the bridges (200), respectively. In this case, the connecting vias (300) can also penetrate the second insulating layers (112) covering the bridges (200). Since the connecting vias (300) pass through the bridges (200) to connect the first metal layers (121) and the second metal layers (122), the first metal layers (121) and the second metal layers (122) may be connected at the shortest distance, and there is no need to bypass the signal paths to connect the first metal layers (121) and the second metal layers (122). Therefore, the signal connection path between the first metal layers (121) and the second metal layers (122) can be simplified, and unnecessary processes and circuit bypass designs can be omitted, thereby reducing costs and improving reliability.

Meanwhile, the connecting vias (300) pass through the bridges (200), but may not contact the bridge circuit layers (202). Since the connecting vias (300) do not contact the bridge circuit layers (202), the signal transmission between the first metal layers (121) and the second metal layers (122) may not be affected by the bridges (200).

If the connecting vias (300) are formed to be in contact with the bridge circuit layers (202), there is a high possibility that a defect will occur because the connecting via (300) must be finely adjusted to match the area of the bridge circuit layers (202) when designing the bridge circuit layers (202). Also, when the connecting vias (300) are formed to contact the bridge circuit layers (202), it is not easy to smoothly form the inside of the through hole because it penetrates the bridge circuit layer (202) together in the step of forming the connecting vias (300). If the inside of the through hole for the connecting vias (300) is not smooth, there is a risk of pores or cracks occurring when forming the connecting vias (300), which will lead to a defect in the connecting vias (300).

Meanwhile, when the connecting vias (300) do not contact the bridge circuit layers (202), it is sufficient to bypass the bridge circuit layers (202) in the region where the connecting vias (300) are disposed, and the connecting vias (300) are disposed in that area. Therefore, when the connecting vias (300) do not contact the bridge circuit layers (202), the defect rate may be further reduced in the bridges (200) manufacturing stage and the connecting vias (300) forming step than when the connecting vias (300) contact the bridge circuit layers (202). Also, since the connecting vias (300) directly connect the first metal layers (121) and the second metal layers (122), when connected to the electronic component, the second metal layers (122) in contact with the connecting vias (300) can be directly connected to the printed circuit board, which can be advantageous for signal transmission and transmission regardless of the design of the bridges (200).

The connecting vias (300) extend to the second metal layers (122) and can be integrated with the second metal layers (122). Since the connecting vias (300) and the second metal layers (122) can be formed simultaneously at the stage of forming the connecting vias (300) by a method such as plating, after forming a through hole through the second insulating layer (112) including the bridges (200), the connecting vias (300) can be integrated with the second metal layers (122). Meanwhile, although not illustrated in FIG. 3, the connecting vias (300) and the second metal layers (122)

may include a seed layer, and the seed layer can be formed integrally. The step of forming the connecting vias (300) may further include a step of removing a residue through desmearing in the above-described operation, and the operation of forming a through hole may also be used without limitation as long as it is necessary in the stage of forming the vias.

The depth of the connecting vias (300) may be substantially the same as the depth of the first vias (131). In the present disclosure, the concept of depth of any configuration may include approximate, for example, errors in the manufacturing process or the measurement process. The depth of the connecting vias (300) means the vertical distance from the area bordering the second metal layer to the area in contact with the first metal layer, and the depth of the first vias (131) means the vertical distance from the area bordering the second metal layer to the area bordering the first metal layer. In the present disclosure, the substantially same is a concept including an approximate one, and may be determined including, for example, a process error, a position deviation, and a measurement error that occur in the manufacturing process. Since the connecting vias (300) and the first vias (131) connect the first metal layers (121) and the second metal layers (122) by penetrating the second insulating layer (112), respectively, the depth of the connecting vias (300) and the depth of the first vias (131) may be substantially identical.

The printed circuit board according to one example may further include adhesive layers (400) interposed between the first insulating layers (111) and the bridges (200). The adhesive layers (400) can perform the role of fixing the bridges (200) to one side of the first insulating layer (111), and a part of the adhesive layers (400) can be penetrated by the connecting vias (300). The materials such as Die Attach Film (DAF) can be used as the material for the adhesive layers (400), but the present disclosure is not limited thereto, and a well-known tape, etc. can be used.

Meanwhile, in FIG. 3, it is expressed that the side surface of the adhesive layers (400) forms the same surface as the side of the bridges (200), but the present disclosure is not limited thereto, and the side surface of the adhesive layers (400) may protrude from the side surface of the bridges (200). In this case, the adhesive layers (400) can be disposed on one surface side of the first metal layers (121), but in some cases, the adhesive layers (400) may cover all of the protruding sides of the first metal layers (121).

The printed circuit board according to one embodiment can mount the bridges (200) on one surface of the first insulating layers (111) without including a cavity. As the bridges (200) may be manufactured to be sufficiently thin, an operation of forming a cavity by stacking a separate insulating layer on the first insulating layers (111) is not required, thereby simplifying a manufacturing process. Also, since there is no additional lamination of insulating layers, the operation of forming a through hole for the connecting vias (300) can be further simplified.

Meanwhile, the printed circuit board according to one embodiment may further include the pads (140) disposed on the second insulating layers (112) and the pad vias (141) penetrating the second insulating layers (112) to connect the bridge circuit layers (202).

The pads (140) are disposed on the bridges (200) and electrically connected to the bridge circuit layers (202), but the present disclosure is not limited thereto, and may be used without distinction from the second metal layers (122) disposed on the second insulating layers (112). The pads (140) are equipped with the electronic components, acts as a channel for electrical signals, and can perform the function of connecting the electronic component to the bridges (200).

The pads (140) may include the metal materials. The metal materials may include copper (Cu), aluminum (Al), silver (Ag), tin (Sn), gold (Au), nickel (Ni), lead (Pb), titanium (Ti), and/or alloys thereof, and may preferably include copper (Cu), but the present disclosure is not limited thereto. The pads (140) can perform various functions according to the design. For example, it can include ground pads, power pads, signal pads, etc. Here, the signal pad may include pads for electrically connecting various signals other than ground, power, etc., for example, data signals, etc. The first pad may be formed of any one of a Semi Additive Process (SAP), Modified Semi Additive Process (MSAP), Tenting (TT), or subtractive construction methods, but the present disclosure is not limited thereto.

The pad vias (141) penetrate the second insulating layers (112) to electrically connect the pads (140) and the bridge circuit layers (202). One surface of the pad vias (141) is connected to the pads (140), and the other surface of the pad vias (141) may be connected to the bridge circuit layers (202). The pad vias (141) electrically connect the pads (140) to the bridges (200) and perform an electrical connection function between electronic components disposed on one surface of the pads (140).

Meanwhile, the printed circuit board according to one embodiment may further include a circuit pattern disposed on the other surface of the first insulating layers, and may further include a via connecting the circuit pattern to the first metal layer. Also, it is not limited to the configuration illustrated in FIG. 3, and may further include a general configuration of a printed circuit board such as another insulating layer, another circuit pattern, a penetration via, and a solder resist disposed on the second insulating layer. That is, it may further include the configuration that can be used by a person skilled in the art.

Figure 4:
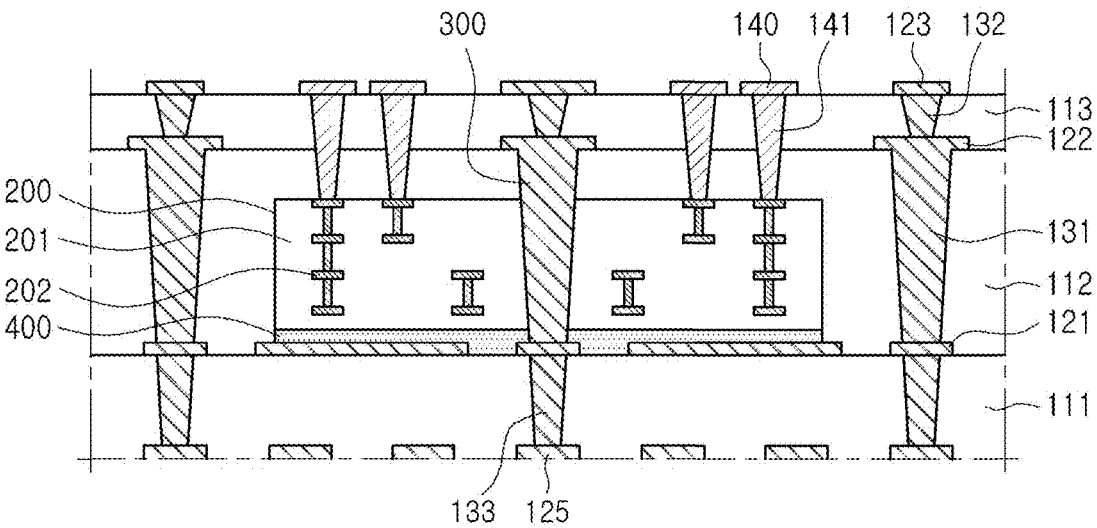
FIG. 4 is a cross-sectional view schematically illustrating the printed circuit board according to another embodiment.

FIG. 4 is a cross-sectional view schematically illustrating a printed circuit board according to another embodiment.

Referring to FIG. 4, the printed circuit board according to another embodiment has the third insulating layers (113) disposed on one surface of the second insulating layers (112), the third metal layers (123) disposed on the third insulating layers (113), the pads (140) disposed on the third insulating layers, and a second via (132) penetrating a third insulating layer (113) to connect the third metal layers (123) and the second metal layers (122), and pad vias (141) penetrating the second insulating layers (112) and the third insulating layers (113) to connect the pads (140) to the bridge circuit layers (202).

The third insulating layers (113) may be disposed on one surface of the second insulating layers (112). The third insulating layers (113) may be formed of materials such as the first insulating layers (111) and the second insulating layers (112), but the present disclosure is not limited thereto, and may include materials different from these. The insulating materials may include one of the materials for the first insulating layers (111) and the second insulating layers (112) described above. The third insulating layers (113) may be disposed on one surface of the second insulating layers (112) and have a structure for embedding the second metal layers (122).

The third metal layers (123) may be disposed on one surface of the third insulating layers (113). The third metal layers (123) may be of the same material as the first metal layers (121) and the second metal layers (122), and may be formed by the same manufacturing method, but the present disclosure is not limited thereto. The third metal layers (123)

can be configured in a plurality of patterns, and the third metal layers (123) can perform a function as a pad for mounting components.

The second vias (132) can penetrate the third insulating layers (113) to connect the third metal layers (123) and the second metal layers (122). The second vias (132) may include the same material as the first vias (131), and may be formed by the same manufacturing method, but the present disclosure is not limited thereto.

Meanwhile, as the third insulating layers (113) are disposed on one surface of the second insulating layers (112), the pads (140) are disposed on one surface of the third insulating layer (113), and the pad vias (141) can penetrate the second insulating layers (112) and the third insulating layers (113). The pads (140) and the pad vias (141) are the same as the printed circuit board according to one embodiment, except that they are disposed on the third insulating layers (113) and that they further penetrate the third insulating layers (113). Meanwhile, even when the third insulating layers (113) and the third metal layers (123) are further included, the connecting vias (300) pass through the second insulating layers (112) and the bridges (200) and do not touch the bridge circuit layers (202), so the first metal layers (121), the second metal layers (122), and the third metal layers (123) may be connected at the shortest distance through the connecting vias (300).

Meanwhile, in FIG. 4, it is expressed as a configuration in which the outermost layer of the bridge circuit layers (202) is embedded in the outermost layer of the bridge insulating layers (201), but this can be formed through a known pattern embedding method as described above in the description of the printed circuit board according to one embodiment. In order for the outermost layer of the bridge circuit layers (202) to be embedded in the outermost layer of the bridge insulating layers (201), the bridges (200) can be manufactured using a carrier substrate, and the bridges (200) can be manufactured using a known pattern embedding method.

Among configurations other than the third insulating layers (113), the third metal layers (123), and the second vias (132), the same configuration as the printed circuit board according to one embodiment can also be applied to the printed circuit board according to the other embodiment, a redundant description thereof is omitted.

Figure 5:
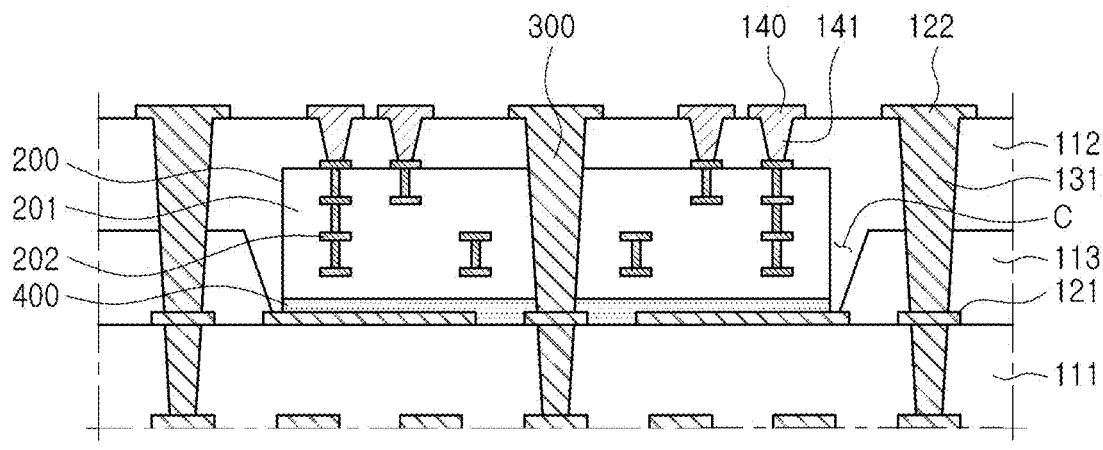
FIG. 5 is a cross-sectional view schematically illustrating the printed circuit board according to another example.

FIG. 5 is a cross-sectional view schematically illustrating a printed circuit board according to another embodiment.

Referring to FIG. 5, the printed circuit board according to another embodiment is disposed between the first insulating layers (111) and the second insulating layers (112), and may include the third insulating layers (113) including a cavity (C).

The third insulating layers (113) are disposed on one surface of the first insulating layers (111) and may be disposed on the other surface facing one side of the second insulating layers (112). The third insulating layers (113) may be formed from the same materials as the first insulating layer (111) and the second insulating layers (112), but not limited thereto, and may contain materials different therefrom. The insulating materials may include one of the materials for the first insulating layers (111) and the second insulating layers (112) described above. The third insulating layers (113) may be disposed on one surface of the first insulating layers (111) and have a structure for embedding the first metal layers (121).

The inclusion of the cavity (C) in the third insulating layers (113) may be the same as the formation of the cavity C penetrating the third insulating layers (113). The wall surface of the cavity (C) may be composed of the third insulating layers (113), and the bottom surface of the cavity (C) may be composed of the first insulating layers (111), but it may also be the first metal layers (121) disposed on the first insulating layers (111). Meanwhile, if the third insulating layers (113) are not completely penetrated, the bottom surface of the cavity (C) may be composed of the third insulating layers (113), etc., and if a cavity (C) penetrating through the third insulating layers (113) is included, it is not limited thereto. In this case, the first metal layers (121) may be composed of metal plate and may perform a function as a stopper layer for forming a cavity (C). Meanwhile, the bridges (200) are mounted in the cavity (C) of the third insulating layers (113), so that the second insulating layers (112) fill the cavity (C), and the bridges (200) can be embedded by the second insulating layers (112). The thickness of the third insulating layers (113) may be less than the thickness of the bridges (200), but the present disclosure is not limited thereto, and may be substantially the same as the thickness of the bridges (200) or may be greater than the thickness of the bridges (200).

Meanwhile, although not illustrated in FIG. 5, the circuit pattern may be further included on one surface of the third insulating layers (113).

Among the configurations other than the third insulating layers (113) and the cavity (C), the same configuration as the printed circuit board according to one embodiment and the printed circuit board according to the other embodiment may also be applied to the printed circuit board according to another embodiment, and thus a redundant description thereof is omitted.

Figure 6:
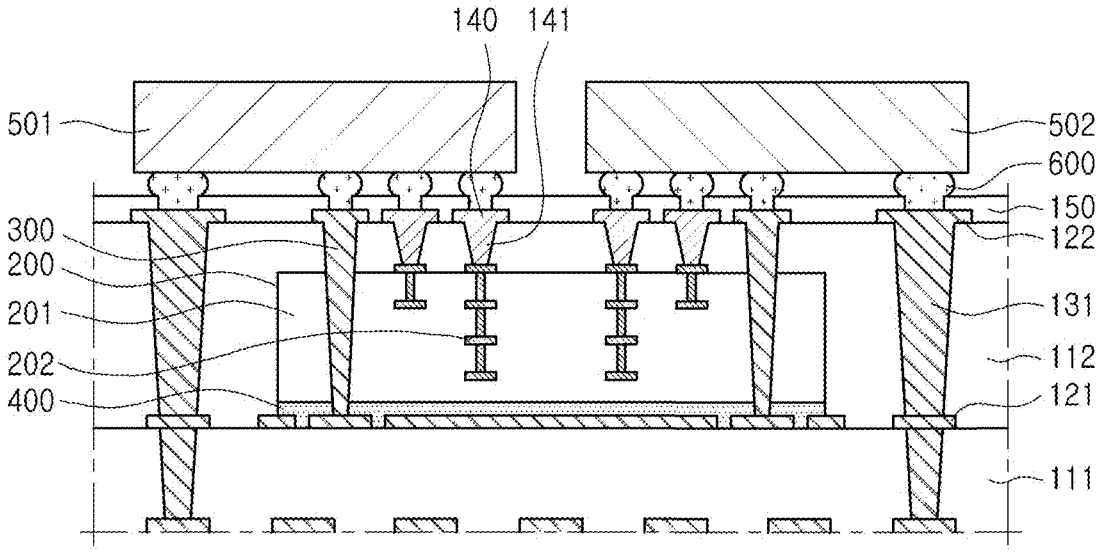
FIG. 6 is a cross-sectional view schematically illustrating the printed circuit board according to another embodiment.

FIG. 6 is a cross-sectional view schematically illustrating a printed circuit board according to another embodiment.

Referring to FIG. 6, the printed circuit board according to another embodiment may further include a solder resist layer (150), a connecting member (600), a first electronic component (501), and a second electronic component (502).

The solder resist layer (150) may be further disposed on one surface of the second insulating layers (112). The solder resist layer (150) protects the printed circuit board from the outside. The solder resist layer (150) includes a thermosetting resin and an inorganic filler dispersed in the thermosetting resin, but may not include glass fibers. The insulating resin may be a photosensitive insulating resin, and the filler may be an inorganic filler and/or an organic filler, but the present disclosure is not limited thereto. However, the material of the solder resist layer (150) is not limited thereto, and other polymer materials may be used as needed. The solder resist layer (150) can embed the second metal layers (122) and the pads (140), but the present disclosure is not limited thereto, and can expose at least a portion of the second metal layers (122) and at least a portion of the pads (140) through an opening as illustrated in FIG. 6. Meanwhile, although not illustrated in FIG. 6, the second metal layers (122) and the pads (140) may be exposed through the opening in the solder resist layer (150).

The printed circuit board according to another example may further include the first electronic component (501) and the second electronic component (502) disposed on the second metal layers (122) and the pads (140). At least a portion of each of the first electronic component (501) and the second electronic component (502) is electrically connected to each other via the bridges (200).

The first electronic component (501) and the second electronic component (502) may be an integrated circuit (IC) die in which hundreds to millions of devices are integrated in one chip, respectively. If necessary, the first electronic component (501) and the second electronic component (502)

may be a chip type inductor or a chip type capacitor in addition to the IC die, and may further include passive components.

The first electronic component (501) and the second electronic component (502) can be electrically connected to the second metal layers (122) and the pads (140) through connecting members (600), and the connecting members (600) may include tin (Sn) or an alloy containing tin (Sn), such as solder (solder), etc., and is not limited thereto, and it may also be composed of a pillar (pillar) containing the metal materials such as copper (Cu). That is, the connection member (600) may be used without limitation as long as it is a means capable of electrically connecting the first electronic component (501) and the second electronic component (502) to the second metal layers (122) and the pads (140).

The first electronic component (501) can be directly connected to the first metal layers (121) via the connecting vias. In this case, the position of the connecting vias (300) can be adjusted as needed. Since the connecting vias (300) do not contact the bridge circuit layers (202), only the connection between the first electronic component (501) and the first metal layers (121) can be performed without considering the signal paths inside the bridges (200). Therefore, the signal paths simplification can be achieved without changing the signal paths of the bridges (200), the first metal layers (121), and the second metal layers (122). Also, since the first electronic component (501) and the first metal layers (121) can be connected by the shortest path, signal loss can be minimized, to improve reliability.

If there are no connecting vias (300) penetrating the bridges (200), the pattern design of the second metal layers (122) connected to the first metal layers (121) must be changed in order to perform the connection between the first electronic component (501) and the first metal layers (121), and a configuration in which the second metal layers (122) are disposed outside the bridges (200) is essential. Accordingly, if the connecting vias (300) that pass through the bridges (200) and do not contact the bridge circuit layer are not included, it may not be easy to change the design of the first electronic component (501), the bridges (200), the first metal layers (121), and the second metal layers (122).

The configuration in which the first electronic component (501) can be directly connected to the first metal layers (121) via the connecting vias (300) can be applied not only to the first electronic component (501), but also to the second electronic component (502), and can be applied simultaneously to the first electronic component (501) and the second electronic component (502) as illustrated in FIG. 6.

Meanwhile, FIG. 6 illustrates that since the electronic components are the first electronic component (501) and the second electronic component (502), they are expressed as including two electronic components, but the present disclosure is not limited thereto, and the electronic components include a large number of electronic components, each of which can be electrically connected via the bridges (200), and can be connected to the first metal layers (121) through the connecting vias (300).

Meanwhile, among configurations other than the solder resist layer (150), the connecting member (600), the first electronic component (501), and the second electronic component (502), the same configuration as the printed circuit board according to one embodiment can also be applied to the printed circuit board according to another embodiment, a redundant description thereof is omitted.

Figure 7:
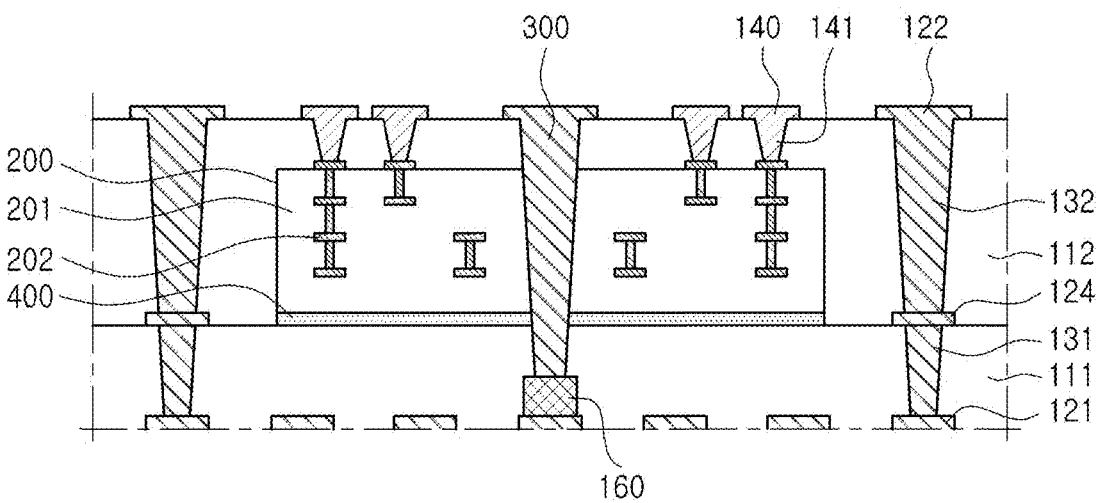
FIG. 7 is a cross-sectional view schematically illustrating the printed circuit board according to another embodiment.

FIG. 7 is a cross-sectional view schematically illustrating a printed circuit board according to another embodiment.

Referring to FIG. 7, the printed circuit board according to another embodiment further includes intermediate metal layers (124) in which the metal layers (121) are embedded in the other side of the first insulating layers (111), and is disposed on one surface of the first insulating layers (111), and a metal post (160) which is disposed on the first metal layers (121) and connected to the connecting vias (300).

The first metal layers (121) may be embedded on the other surface side of the first insulating layers (111). The structure that the first metal layers (121) are embedded on the other surface side of the first insulating layers (111) means that that one surface of the first metal layers (121) is exposed to the other surface of the first insulating layers (111) when the first metal layers (121) are embedded in the other surface of the first insulating layers (111). On the other hand, although not illustrated in the FIG. 7, an insulating layer may be further disposed on the other side of the first insulating layers (111).

Since the first metal layers (121) have a structure embedded on the other side of the first insulating layers (111), the connecting vias (300) can connect the first metal layers (121) and the second metal layers (122) by penetrating the bridges (200), the first insulating layers (111), and the second insulating layers (112). Even in this case, the connecting vias (300) do not contact the bridge circuit layers (202).

One surface of the first insulating layers (111) may further include intermediate metal layers (124). The intermediate metal layers (124) correspond to the metal layers disposed between the first metal layers (121) and the second metal layers (122), and may be of the same material as the first metal layers (121) and the second metal layers (122), and may be formed by the same manufacturing method, but the present disclosure is not limited thereto. The intermediate metal layers (124) may be composed of a plurality of patterns. The intermediate metal layers (124) are disposed on one surface of the first insulating layers (111), they may not be disposed in the area where the bridges (200) are mounted.

The first vias (131) can connect the first metal layers (121) and the intermediate metal layers (124), and the second vias (132) can connect the second metal layers (122) and the intermediate metal layers (124).

Meanwhile, since the connecting vias (300) connect the first metal layers (121) and the second metal layers (122) through the bridges (200), the first insulating layers (111) and the second insulating layers (112), the depth of the connecting vias (300) may be deeper than the depth of the first vias (131) and the depth of the second vias (132). Since the intermediate metal layers (124) are not disposed in the area where the bridges (200) are disposed, the through hole for the connecting vias (300) can collectively penetrate the bridges (200), the first insulating layers (111), and the second insulating layers (112). Meanwhile, since the first vias (131) penetrating the first insulating layers (131) and the second vias (132) penetrating the second insulating layers (112) are disposed in the area where the intermediate metal layers are disposed, the depth of the connecting vias (300) may be deeper than the depth of each of the first vias (131) and the second vias (132). Even at the stage of forming the connecting vias (300) deeper than the depth of the first vias (131) and the second vias (132), since the connecting vias (300) do not contact the bridge circuit layers (202), it is easy to form the through hole for the connecting vias (300).

Meanwhile, the printed circuit board according to another embodiment may further include a metal post (160) disposed on the first metal layer (121).

The metal post (160) may include a metal such as the first metal layers (121) and may be formed by the same manufacturing method, but the present disclosure is not limited thereto. The connecting vias (300) may be connected to the first metal layers (121) through the metal post (160). As the metal post (160) is disposed, the connecting vias (300) connecting the first metal layers (121) and the second metal layers (122) can be prevented from becoming too long. In other words, the metal post (160) can be disposed on the first metal layers (121) to partially replace the connecting vias (300). However, since the thickness of the metal post (160) may not be greater than the thickness of the first insulating layers (111), the depth of the connecting vias (300) may be deeper than the depth of the first vias (131) and the depth of the second vias (132) even if the connecting vias (300) are connected through the metal post (160).

Meanwhile, the same configuration as the printed circuit board according to one embodiment of a configuration other than the intermediate metal layers (124) and the metal post (160) may be applied to the printed circuit board according to another embodiment, so a redundant description thereof is omitted.

Figure 8:
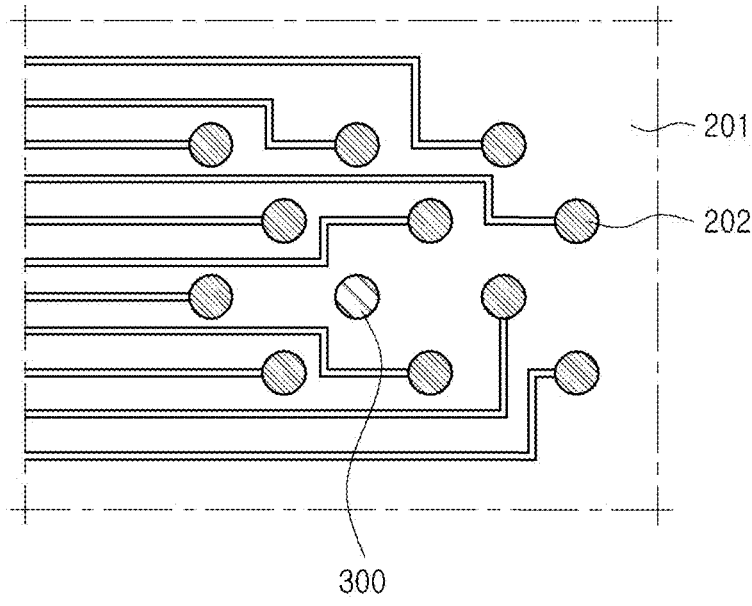
FIG. 8 is a plan view of a bridge area of the printed circuit board as viewed from an upper surface according to another embodiment.

FIG. 8 is a plan view of a bridge area of a printed circuit board as viewed from an upper surface according to an embodiment.

Referring to FIG. 8, the bridge circuit layers (202) included in the bridges (200) may be disposed in the bridge insulating layers (201) and may not be disposed in the area where the connecting vias (300) are formed. Since the bridge circuit layers (202) are not disposed in the area where the connecting vias (300) are formed, they do not contact the bridge circuit layers (202) even if the connecting vias (300) pass through the bridges (200), and signal paths can be diversified and simplified. Meanwhile, FIG. 8 is only a schematic representation of the bridge according to the embodiment, and although not illustrated in the figure, the bridge according to the embodiment may have a structure in which the pattern of the bridge circuit layers (202) are embedded by the bridge insulating layers (201), and multiple regions for the connecting vias (300) may be formed.

In the present disclosure, the meaning on the cross-section may mean a cross-sectional shape when an object is cut vertically, or a cross-sectional shape when the object is viewed from a side-view. Also, the meaning on the plane may be the shape when the object is cut horizontally, or the shape of a plane when the object is viewed in a top-view or bottom-view.

In the present disclosure, an upper side, an upper part, and a top surface are used to refer to a direction toward a surface on which the electronic component may be mounted based on the cross section of the drawings, and a lower side, a lower part, and a bottom surface are used in a direction opposite to each other. However, this defines the direction for convenience of explanation, it is natural that the scope of the patent claim is not particularly limited by the description of this direction.

In the present disclosure, the meaning of being connected is a concept that includes not only directly connected, but also indirectly connected through an adhesive layer or the like. Also, the meaning of being electrically connected is a concept that includes both physically connected and not connected. Also, the expressions such as first and second are used to distinguish one component from another, and do not limit the order and/or importance of the components. In some cases, without going beyond the scope of rights, the first component may be named as the second component, and similarly, the second component may be named as the first component.

The expression "embodiment" used in this disclosure does not mean the same embodiment, and is provided to emphasize and explain different unique features. However, it is not excluded that the embodiments presented above are implemented in combination with the features of another embodiment. For example, even if a matter described in a particular example is not explained in another embodiment, it can be understood as an explanation relating to another embodiment, unless there is an explanation opposite or contradictory to that point in another embodiment.

The terms used in this disclosure are used only to describe an embodiment, and are not intended to limit this disclosure. In this case, singular expressions include multiple expressions, unless the context clearly means otherwise.

While embodiments have been shown and described above, it will be apparent to those skilled in the art that modifications and variations could be made without departing from the scope of the present disclosure as defined by the appended claims.

What is claimed is:

1. A printed circuit board, comprising, a first insulating layer;

a first metal layer disposed on the first insulating layer;

a bridge disposed on the first metal layer, and including a bridge insulating layer and a bridge circuit layer;

a second insulating layer disposed on the first insulating layer, and covering at least a portion of the bridge;

a second metal layer disposed on the second insulating layer; and a connecting via penetrating the bridge and the second insulating layer to directly connect the first metal layer to the second metal layer, wherein the connecting via is spaced apart from the bridge circuit layer.

2. The printed circuit board of claim 1, further comprising:

a first via penetrating the second insulating layer to connect the first metal layer and the second metal layer, wherein the first via is spaced apart from the bridge.

3. The printed circuit board of claim 2, wherein a depth of the connecting via is substantially the same as a depth of the first via.

4. The printed circuit board of claim 1, wherein connecting via extends to the second metal layer to be integrated with the second metal layer.

5. The printed circuit board of claim 1, further comprising:

an adhesive layer interposed between the bridge and the first metal layer.

6. The printed circuit board of claim 1, further comprising:

a pad disposed on the second insulating layer; and a pad via penetrating the second insulating layer to connect the pad to the bridge circuit layer.

7. The printed circuit board of claim 6, further comprising:

a first electronic component and a second electronic component disposed on the second metal layer and the pad.

8. The printed circuit board of claim 7, wherein at least a portion of the first electronic component is disposed on the pad and connected to the bridge, and at least a portion of the second electronic component is disposed on the pad and connected to the bridge.

9. The printed circuit board of claim 7, wherein the first electronic component is connected to the first metal layer through the second metal layer and the connecting via.

10. The printed circuit board of claim 1, further comprising:

a third insulating layer disposed on the second insulating layer;

a third metal layer disposed on the third insulating layer;

a pad disposed on the third insulating layer;

a second via penetrating the third insulating layer to connect the third metal layer to the second metal layer; and a pad via penetrating the second insulating layer and the third insulating layer to connect the pad to the bridge circuit layer.

11. The printed circuit board of claim 1, further comprising:

a third insulating layer disposed between the first insulating layer and the second insulating layer and having a cavity, wherein the bridge is mounted in the cavity of the third insulating layer.

12. The printed circuit board of claim 1, wherein a circuit density of the bridge circuit layer is higher than a circuit density of the first metal layer.

13. A printed circuit board, comprising:

a first insulating layer;

a bridge disposed on one surface of the first insulating layer, and including a bridge insulating layer and a bridge circuit layer;

a first metal layer embedded on the other surface of the first insulating layer;

a second insulating layer disposed on the one surface of the first insulating layer, and covering at least a portion of the bridge;

a second metal layer disposed on one surface of the second insulating layer; and a connecting via penetrating the bridge, the first insulating layer and the second insulating layer to directly connect the first metal layer to the second metal layer, wherein the connecting via is spaced apart from the bridge circuit layer.

14. The printed circuit board of claim 13, further comprising:

an intermediate metal layer disposed on the one surface of the first insulating layer;

a first via penetrating the first insulating layer to connect the first metal layer and the intermediate metal layer; and a second via penetrating the second insulating layer to connect the second metal layer to the intermediate metal layer, wherein the first via and the second via are spaced apart from the bridge.

15. The printed circuit board of claim 14, wherein a depth of the connecting via is deeper than a depth of the first via and a depth of the second via.

16. The printed circuit board of claim 14, further comprising:

a metal post disposed on the first metal layer, wherein the connecting via is connected to the first metal layer through the metal post.

17. A printed circuit board, comprising, a first insulating layer;

a first metal layer disposed on the first insulating layer;

a bridge disposed on the first metal layer, and including a bridge insulating layer and a bridge circuit layer;

a second insulating layer disposed on the first insulating layer, and covering at least a portion of the bridge;

a second metal layer disposed on the second insulating layer;

a connecting via penetrating the bridge and the second insulating layer to directly connect the first metal layer to the second metal layer;

a bottom metal layer embedded in the first insulating layer and having a surface externally exposed from the printed circuit board; and a bottom via disposed in the first insulating layer and connecting the bottom metal layer and the first metal layer to each other, wherein the bottom via and the connecting via overlap each other in a stacking direction of the first insulating layer and the second insulating layer.

18. The printed circuit board of claim 17, further comprising:

a first via penetrating the second insulating layer to connect the first metal layer and the second metal layer, wherein the first via is spaced apart from the bridge.

19. The printed circuit board of claim 17, further comprising:

a pad disposed on the second insulating layer; and a pad via penetrating the second insulating layer to connect the pad to the bridge circuit layer.

20. The printed circuit board of claim 17, wherein the connecting via is spaced apart from the bridge circuit layer.

* * * * *